United States Patent [19]

Morishige

[11] Patent Number: 5,506,448
[45] Date of Patent: Apr. 9, 1996

[54] SEMICONDUCTOR INTEGRATED CIRCUIT DEVICE HAVING AN IMPROVED PACKAGING STRUCTURE

[75] Inventor: Sueo Morishige, Tokyo, Japan

[73] Assignee: NEC Corporation, Tokyo, Japan

[21] Appl. No.: 361,970

[22] Filed: Dec. 22, 1994

[30] Foreign Application Priority Data

Dec. 27, 1993 [JP] Japan ................... 5-332158

[51] Int. Cl.⁶ .................................................. H01L 23/48
[52] U.S. Cl. .......................... 257/697; 257/701; 257/704; 257/723
[58] Field of Search ................... 257/697, 704, 257/723, 705, 701, 700, 778, 782

[56] References Cited

U.S. PATENT DOCUMENTS

| | | | |
|---|---|---|---|
| 4,417,392 | 11/1983 | Ibrahim et al. | 257/704 |
| 5,018,004 | 5/1991 | Okinaga et al. | 257/697 |
| 5,097,318 | 3/1992 | Tanaka et al. | 257/704 |

FOREIGN PATENT DOCUMENTS 2-165675   6/1990   Japan .

*Primary Examiner*—William Mintel
*Assistant Examiner*—Roy Potter

[57] ABSTRACT

Semiconductor IC device comprises an IC chip fixed to a top surface of a carrier board having top electrodes located on a periphery of the top surface. The carrier board further includes bottom electrodes on a bottom surface each connected to corresponding one of the top electrodes by an interconnection formed within the carrier board. The bottom electrodes of the carrier board are electrically connected to and mechanically fixed to internal electrodes of a package container having pin grids each connected to corresponding one of the internal electrodes. The bottom electrodes are arranged in a matrix for standardized structure. Variety of types of inexpensive carrier boards are prepared to variety of IC chips so that the number of the types of expensive package containers is reduced and a stock cost thereof is significantly reduced.

11 Claims, 2 Drawing Sheets

5,506,448

SEMICONDUCTOR INTEGRATED CIRCUIT DEVICE HAVING AN IMPROVED PACKAGING STRUCTURE

BACKGROUND OF THE INVENTION

1. Field of the Invention

The present invention relates to a semiconductor integrated circuit (referred to as an IC hereinafter) device having an improved package structure and, more particularly, to an IC device having an improved structure for assembling a semiconductor IC chip in a package.

2. Description of the Prior Art

FIG. 1 is a schematic cross-sectional view of a conventional IC device as an example of a package structure of this type, in which a semiconductor IC chip 41 is fixed onto a inside bottom surface of a ceramic package 42 by an adhesive such as an eutectic solder or an epoxy resin.

The package 42 has a plurality of inner or internal electrodes 43 each connected by bonding to one or two of bonding pads of the IC chip 41 through a metallic capillary wire 44. Each of the internal electrodes 48 is also connected electrically to corresponding one of external terminals 46 such as pin grids of the package 42 by use of internal metallic interconnection included in the package 42.

In a fabrication step for packaging of IC device, after the inner electrodes 43 are connected with the bonding pads of the IC chip 41, the package container 42 is sealed with a metallic cap 45 on a sealing post 47 by using a welding technology such as resistance or arch welding or by using an eutectic solderring technology such as a tin-gold alloy solderring so as to protect the semiconductor chip 41.

In an IC package structure as described above, the layout of the internal electrodes 43 is restricted by a layout of bonding pads formed in the IC chip 41 as well as a length of the metallic capillary wire which can be safely connected between the bonding pads and the internal electrodes without contacting with any other conductor.

Recently, families and varieties of semiconductor chips have a tendency to increase every year, which makes it necessary to start a new packaging design when a design change in a layout of bonding pads is desired in the semiconductor IC chip. Furthermore, it is also necessary to develop a new package at each time when a dimensional change of an IC chip 41 such as shown in FIG. 1 is required, even if a layout of the bonding pads stays same.

Consequently, the number of and expenses in development of new packages increase and varieties of packaging species increase so that cost of the IC device rises. Moreover, even a small number of ceramic packages in a stock induced by a slight fluctuation in production quantity will sum up to a large amount in stock money because of a high unit cost of the ceramic package.

Besides, the dimension of the package limits the size of an IC chip to be assembled in the package partly because a metallic capillary wire for connecting the IC bonding pads to the internal electrodes 43 contacts with an inner fringe 47 of the package 42. Although an enlargement in the external dimension of the package may solve those problems, large packages reduce a mounting density of IC packages.

SUMMARY OF THE INVENTION

It is an object of the present invention to provide a semiconductor device having a new package adapted to a variety of size and design of the IC chip.

According to the present invention, there is provided a semiconductor integrated circuit comprising: at least one IC chip having therein a plurality of semiconductor elements and a plurality of bonding pads connected to the semiconductor elements; a carrier board having a top surface for mounting a plurality of top electrodes, at least a part of said top electrodes being connected to corresponding one of the bonding pads by bonding wire, a bottom surface for mounting a plurality of bottom electrodes, and a first interconnection formed within said carrier board and connecting each of the top electrodes to corresponding one of the bottom electrodes, the semiconductor chip being fixed to the top surface; and a package container having an internal surface for mounting a plurality of internal electrodes, an external surface for mounting a plurality of external electrodes, and a second interconnection connecting each of the internal electrodes to corresponding one of the external electrodes, wherein the carrier board is fixed to the package container through bonding each of the bottom electrodes to corresponding one of the internal electrodes.

In the IC chip according to the present invention, varieties of package containers can be decreased drastically and a decrease in stock number of the package container can be attained, even if a production scale of each type of the semiconductor chips is small in quantity whereas the varieties of types are large in number.

BRIEF DESCRIPTION OF THE DRAWINGS

The above and further objects as well as features and advantages of the present invention will be more apparent from the following description, taken in conjunction with accompanying drawings in which.

DESCRIPTION OF THE PREFERRED EMBODIMENTS

Figure 1:
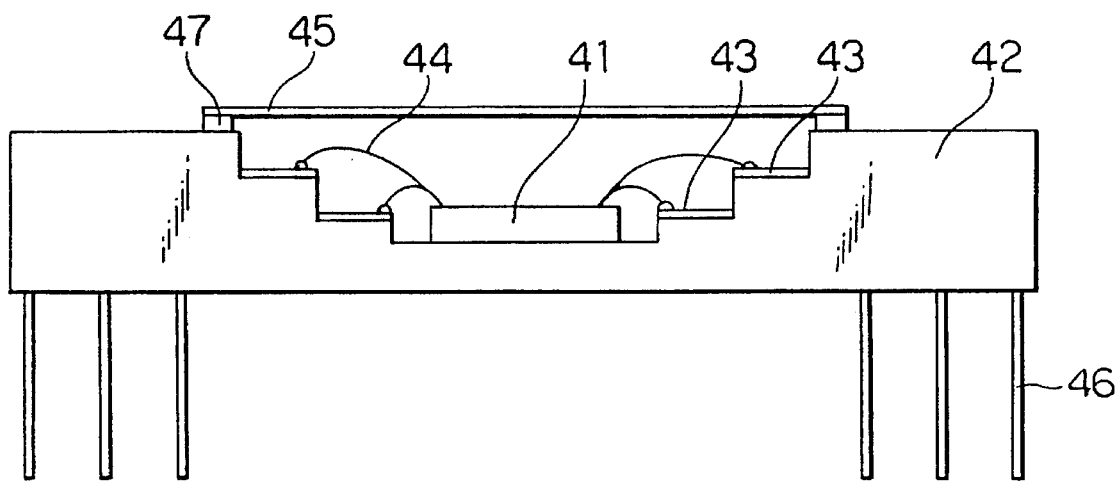
FIG. 1 is a cross-sectional view of a conventional semiconductor IC device.
Figure 2:
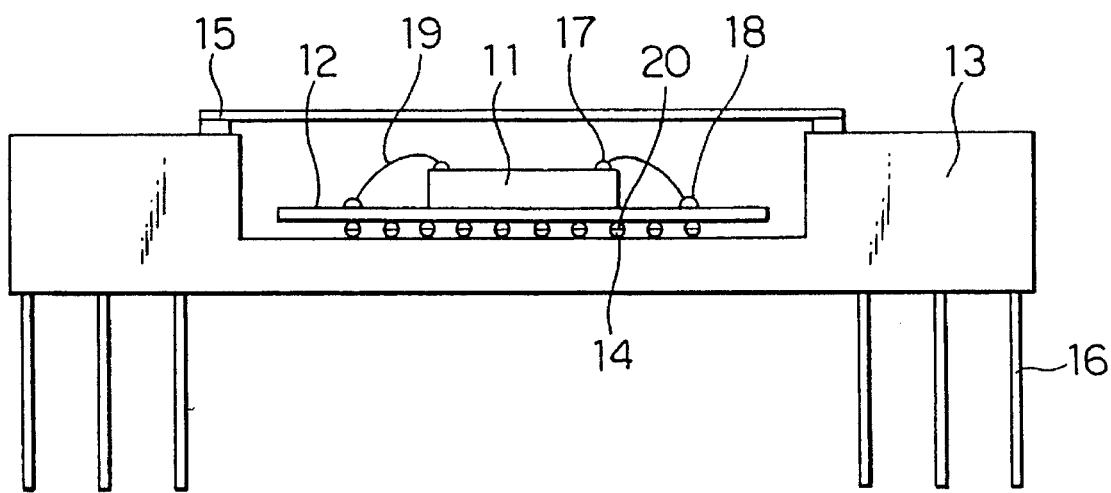
FIG. 2 is a cross-sectional view of a semiconductor IC device according to a first embodiment of the present invention.

Referring to FIG. 2, there is shown a vertically cross-sectional view of a semiconductor IC device according to a first embodiment of the present invention.

The IC device is mainly composed of an IC chip 11 having semiconductor elements and bonding pads 17 therein, a carrier board 12 for mounting the IC chip 11 on a-top surface thereof, and a ceramic package container 13 for mounting the carrier board 12 with the bottom surface thereof bonded to the internal electrodes of the inner bottom surface of the ceramic package container 13.

The IC chip 11 is fixed by an eutectic solderring or a resin adhesive to the top surface of the carrier board 12 mounting a plurality of top electrodes 18 located on a peripheral portion of the top surface of the carrier board 12. A metallic capillary wire 19 connects at least one of the bonding pads 17 of the IC chip 11 to corresponding one of the top electrodes 18, which in turn is connected to corresponding one of the bottom electrodes 20 of the carrier board 12 by internal interconnection of the carrier board 12. The carrier board 12 is made of a laminate including a plurality of resin layers and interconnections for connecting each of the top electrodes 18 to corresponding one of the bottom electrodes 20.

The carrier board 12 is fixed to the inner bottom surface of the ceramic package container 13, with the bottom electrodes 20 thereof bonded to the internal electrodes 14 of the package container 13. The internal electrodes 14 of the package container 13 are connected to the pin grids 16 of the package container 13 by interconnections of the package container 13. The bottom electrodes 20 and the internal electrodes 14 are arranged correspondingly in a matrix so that each of the bottom electrodes 20 is electrically bonded and mechanically fixed to a corresponding one of the internal electrodes 14 of the package container 13. The package container 13 is made of a laminate of a plurality of ceramic sheets including therein metallic interconnections. The package container 13 is sealed by a cap 15 for receiving the IC chip 11 and the carrier board 12.

Figure 3:
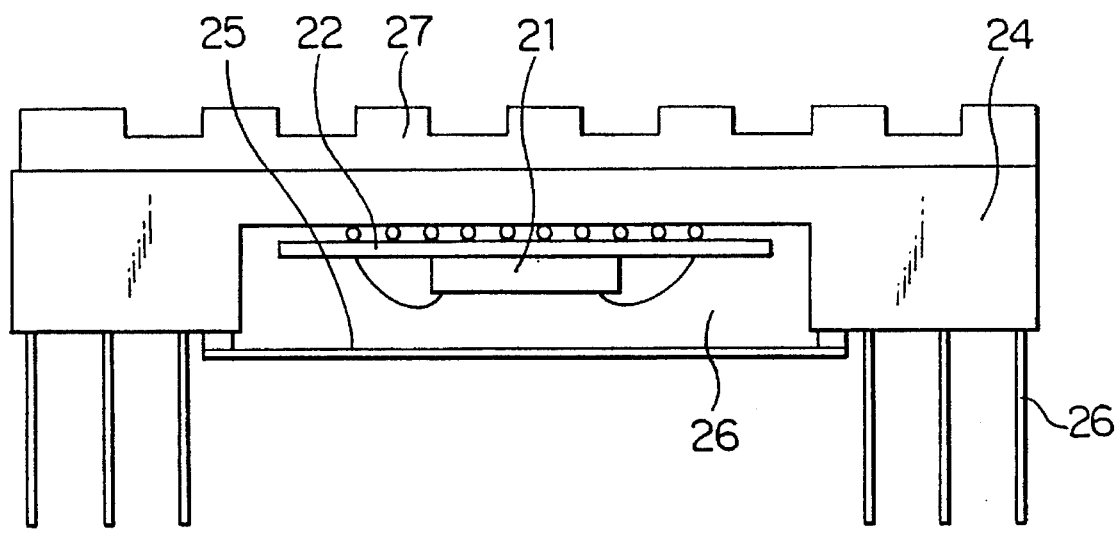
FIG. 3 is a cross-sectional view of a semiconductor IC device according to a second embodiment of the present invention.

FIG. 3 is a cross-sectional view showing a schematic construction of a semiconductor IC device according to a second embodiment of the present invention. The IC device of FIG. 3 has a structure for an efficient heat-radiation ability to meet a demand for packaging a highly heat-dissipating IC chip. The ceramic package container 24 has a bottom opening 26 for receiving therethrough an IC chip 21 and a carrier board 22, and a top radiator 27 attached to the external top surface thereof. The carrier board 22 has a top surface for mounting the IC chip 21 and a bottom surface to be secured to the inner surface of the ceramic package 24. The bonding structures between the IC chip 21 and the top surface of the carrier board 22 and between the bottom surface of the carrier board 22 and the inner surface of the ceramic package 24 are similar to those of the IC device of the first embodiment.

Figure 4:
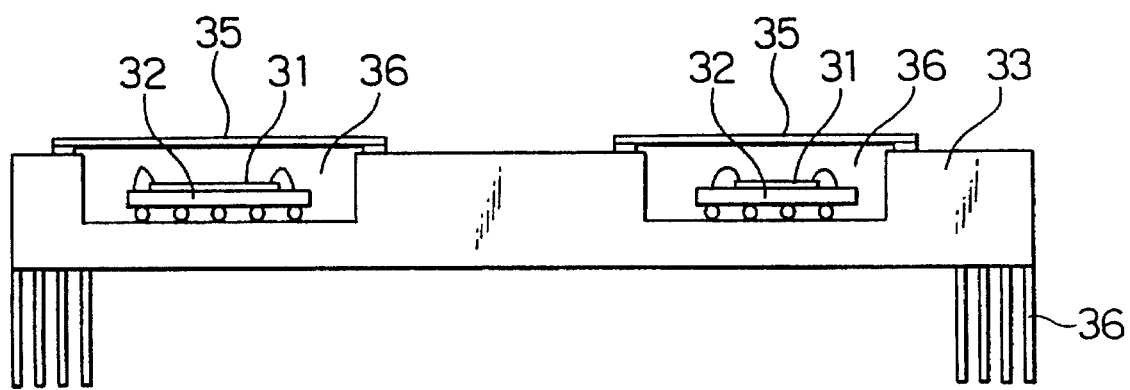
FIG. 4 is a cross-sectional view of a semiconductor IC device according to a third embodiment of the present invention.

FIG. 4 is a cross-sectional view of an IC device according to a third embodiment of the present invention. The IC device is formed as a multichip module and comprises a plurality recesses 36 each for receiving a combination of an IC chip 31 and a carrier board 32 contained in a single ceramic package container 33. Each of the combinations are sealed by a cap 35 within corresponding one of recesses 36 of the package container 33. The bonding structures of the IC device of FIG. 4 are similar to those of the IC device of FIG. 2.

According to the embodiments as described above, the package container can be of a standard dimension adapted for any type of the IC chip or at least several types of the IC chip or IC chips contained therein. Although the carrier boards should be formed as adapted to the size of the IC chips, the varieties of the carrier board decrease as compared to the varieties of the conventional package, because the number of the top or bottom electrodes of the carrier board is not necessarily equal to the number of the bonding pads of the IC chip and the internal electrodes of the package container. The number of the top electrodes of the carrier board is requested not less than the effective number of the bonding pads of the IC chip, while the number of the internal electrodes of the package container should not be less than the number of the bottom electrodes of the carrier board.

Hence, the number of type of IC packages may be small and consequently the stock money will be decreased in accordance with the present invention. The stock money can be decreased owing to a small number of types of the carrier boards and a low cost of the carrier boards itself as compared to a large number of types and a high unit cost of a conventional package.

As to a shipment lead time, the new carrier board structure is suitable for a short-time delivery because the number of laminated sheets of the carrier board is much less than that of the laminated sheets of a conventional package, so that manufacturing of the carrier board requests only about a half of the process steps as compared to that of a conventional package. The carrier board has a simple structure including at least one row of top electrodes, an array of bottom electrodes and inexpensive printed interconnection.

Although the present invention is described with reference to the preferred embodiments, the present invention is not limited to such embodiments thereof and it will be obvious for those skilled in the art that various modifications or alterations can be easily made based on the above embodiments within the scope of the present invention.

What is claimed is:

1. A semiconductor integrated circuit comprising: at least one IC chip including therein a plurality of semiconductor elements and a plurality of bonding pads connected to said semiconductor elements; a carrier board having a top surface for mounting thereon a plurality of top electrodes, at least a part of said top electrodes being connected to a corresponding one of said bonding pads by a bonding wire, said carrier board further having a bottom surface for mounting thereon a plurality of bottom electrodes arranged in a matrix, and first interconnections formed within said carrier board and connecting each of said top electrodes with each corresponding one of said bottom electrodes, said IC chip being fixed to said top surface; and a package container having an internal surface for mounting a plurality of internal electrodes arranged in correspondence to said bottom electrodes, an external surface for mounting a plurality of external electrodes, and second interconnections connecting each of said internal electrodes to each corresponding one of said external electrodes, said carrier board being fixed to said package container through bonding each of said bottom electrodes to each corresponding one of said internal electrodes.

2. A semiconductor integrated circuit as defined in claim 1 wherein said top electrodes are arranged in at least one row on said top surface.

3. A semiconductor integrated circuit as defined in claim 1 wherein said bonding wire is metallic capillary wire.

4. A semiconductor integrated circuit as defined in claim 1 wherein said carrier board includes a laminate of a plurality of resin layers.

5. A semiconductor integrated circuit as defined in claim 1 wherein said carrier board includes a laminate of a plurality of ceramic layers.

6. A semiconductor integrated circuit as defined in claim 1 further comprising a cap encapsulating said IC chip and said carrier board together with said package container.

7. A semiconductor integrated circuit as defined in claim 1 wherein each of said bottom electrodes is bonded to each corresponding internal electrode by a soldering material.

8. A semiconductor integrated circuit as defined in claim 1 wherein each of said bottom electrodes is bonded to each corresponding internal electrode by a conductive resin.

9. A semiconductor integrated circuit as defined in claim 1 wherein said IC chip is die-bonded to said top surface of said carrier board.

10. A semiconductor integrated circuit comprising: a plurality of IC chips each including a plurality of semiconductor elements and a plurality of bonding pads connected to said semiconductor elements; a plurality of carrier boards each positioned for mounting a corresponding one of said IC chips thereon, each of said carrier boards having a top surface for mounting a plurality of top electrodes and a corresponding one of said IC chips, at least a part of said top electrodes being connected to a corresponding one of said bonding pads by a bonding wire, each carrier board further having a bottom surface for mounting a plurality of bottom electrodes arranged in a matrix, and first interconnections formed within said carrier board and connecting each of said top electrodes with each corresponding one of said bottom electrodes; and a package container having a plurality of recesses each for receiving a corresponding one of said carrier boards, each of said recesses being provided with a plurality of internal electrodes arranged correspondingly to said bottom electrodes, said package container having an external surface for mounting thereon a plurality of external electrodes, and second interconnections connecting each of said internal electrodes to each corresponding one of said external electrodes, each of said carrier boards being fixed to said package container through bonding each of said bottom electrodes to each corresponding one of said internal electrodes.

11. A semiconductor integrated circuit comprising: at least one IC chip including therein a plurality of semiconductor elements and a plurality of bonding pads connected to said semiconductor elements; a carrier board having a top surface for mounting thereon said IC chip and a plurality of top electrodes, at least a part of said top electrodes being connected to a corresponding one of said bonding pads by a bonding wire, said carrier board having a bottom surface for mounting thereon a plurality of bottom electrodes arranged in a matrix, and first interconnections formed within said carrier board and connecting each of said top electrodes with each corresponding one of said bottom electrodes; and a package container having a top surface having a plurality of external electrodes, a bottom surface implementing a radiator, an inner surface disposed opposite to said bottom surface and mounting a plurality of internal electrodes arranged correspondingly to said bottom electrodes, and second interconnections connecting each of said internal electrodes to each corresponding one of said external electrodes, said carrier board being fixed to said inner surface of said package container through bonding each of said bottom electrodes to each corresponding one of said internal electrodes.

* * * * *